United States Patent [19]

Considine

[11] Patent Number: 4,492,460
[45] Date of Patent: Jan. 8, 1985

[54] METHOD OF MAKING REPRESENTATIONS OF, AND METHOD OF AND MEANS FOR MAKING, PRINTED CIRCUIT BOARDS

[76] Inventor: William H. Considine, Haymans Ghyll, Coolham, Nr. Horsham, Sussex, England

[21] Appl. No.: 359,659
[22] PCT Filed: Jul. 8, 1981
[86] PCT No.: PCT/GB81/00134
  § 371 Date: Mar. 1, 1982
  § 102(e) Date: Mar. 1, 1982
[87] PCT Pub. No.: WO82/00398
  PCT Pub. Date: Feb. 4, 1982

[30] Foreign Application Priority Data

Jul. 10, 1980 [GB] United Kingdom ............ 8022667

[51] Int. Cl.³ .......................................... G03B 27/02
[52] U.S. Cl. .................................. 355/133; 355/132; 430/22
[58] Field of Search .............. 355/132, 133; 430/22, 430/319

[56] References Cited

U.S. PATENT DOCUMENTS 3,477,848 11/1969 Pritchard, Jr. ................ 430/22 X
3,740,225 6/1973 Fiderer ........................... 430/22 X

FOREIGN PATENT DOCUMENTS 2008366 2/1970 Fed. Rep. of Germany.
7628321 4/1979 France.
284513 1/1965 Netherlands.
2040499 3/1979 United Kingdom.
2009517 6/1979 United Kingdom.

*Primary Examiner*—Richard A. Wintercorn
*Attorney, Agent, or Firm*—Lucas & Just

[57] ABSTRACT

A modular printed circuit construction using visual or other representations (1 to 7) which can be arranged so as to produce a visual pattern in which continuous interconnections between the modules appear (automatically as a result of overlapping of individual representations). The composite visual pattern can be used to produce a unitary printed circuit board. Alternatively the individual printed circuit boards can be combined in a board assembly using a mounting frame or edge connectors. Two dimensional extension is possible. Particular applications include microprocessor systems (include parallel processors using a common memory). Bus lines can extend completely across individual representations or the unitary board. The positions of such lines can be determined in dependence on the number of individual representations to which they are common.

22 Claims, 7 Drawing Figures

| I1 | M1 | P1 | B1 | MC | B2 | P2 | M2 | I2 |

METHOD OF MAKING REPRESENTATIONS OF, AND METHOD OF AND MEANS FOR MAKING, PRINTED CIRCUIT BOARDS

This invention relates to a method of making representations of, and a method of and means for making, printed circuit boards. The invention also relates to printed circuit boards and board assemblies.

Printed circuit boards are normally manufactured by photographically reproducing an accurate positive or negative print of a circuit diagram, commonly referred to as a master, onto a copper covered insulation board, and removing, by chemical means, the unwanted copper.

Electronic systems are conventionally assembled on printed circuit boards (p.c.b.s.) that are designed to a particular specification. Each board carries out a circuit function which is defined at the time that the board is designed. Certain limited adaptation may be possible by providing links or other variable devices, but the function of each board is virtually fixed.

If flexibility is required in an overall system then the latter is subdivided into defined function portions each of which is designed as a separate printed circuit board. The boards required to form a complete system circuit are fitted to a mounting frame and connected by means of wiring and connectors.

It is always desirable, from the viewpoint of cost and reliability, to minimise the number of different boards, so as to minimise the interconnections. For small systems, it is highly desirable to have only a single board which is easier to handle, manufacture and mount than a plurality. This is often not sufficiently flexible, however, because the cost of designing a board is usually between 100 and 1000 times the cost of the board itself, and therefore, a board designed for one application will not be economically viable unless required in quantities of at least 100.

Microprocessors can now be effectively employed as a substitute for small control systems, since the price of the processor, associated memory, and programming has fallen to a point where systems of a few relays can be replaced.

However, these small systems comprise widely varying configurations, and are only produced in small numbers. Mounting frame systems are not economically viable and may often make the system too bulky to be accommodated inside a small machine.

According to a first aspect of this invention there is provided a method of making a system of representations of printed circuit board sections and comprising the steps of forming at least two printed circuit board (p.c.b.) section representations having portions corresponding to inter-p.c.b. section connections which are to provide interconnections between two circuit portions respectively represented by the representations, characterised by arranging the corresponding inter-p.c.b. section connection portions of the representations such that visually continuous interconnections can be formed between the circuit portions when the representations are caused to provide a visual pattern of the complete circuit represented by the combined representations.

According to a second aspect of this invention there is provided means for making a printed circuit board and comprising at least two printed circuit board section representations having portions corresponding to inter-p.c.b. section connections which are to provide interconnections between two circuit portions respectively represented by the representations, characterised in that the corresponding inter-p.c.b. section connection portions of the representations are such that visually continuous interconnections can be formed between the circuit portions when the representations are caused to provide a visual pattern of the complete circuit represented by the combined representations.

Conveniently the representations comprise visual representations in the form of photographically recorded images of the relevant circuit portions, the overall visual pattern being produced by appropriate juxtaposition of the visual representations or of their simultaneously or successively produced images on a receptive surface such as a light-sensitised copper coated insulation board or a photographic element.

A printed circuit board aspect can be produced using the means according to the second aspect. The latter means can also be used to make printed circuit boards corresponding to the individual p.c.b. sections.

According to a third aspect of this invention there is provided a printed circuit board assembly comprising at least two printed circuit boards having printed circuits terminating at edge portions of the two boards in respective connector arrangements which, when the boards are coplanar, are mirror symmetrical about a notional plane normal to the board plane and parallel with and between the edge portions. It is to be noted that the mirror symmetry relates to the connector "arrangements" and allows the corresponding connectors of the respective arrangements to be different e.g. male and female edge connectors.

The boards so formed can be mounted and interconnected in a conventional wired frame or can be directly interconnected using connectors without frames and wiring. The connectors used may be male-female edge connectors or where stacking is required, can be connectors (pins or strip cables) mounted upright on the boards.

When applied to microprocessor systems the separate circuit portions would have the address, data, and control buses extending from one side to the other, so that, when printed side by side, the buses run the full width of the composite board, giving each circuit portion access to all signals. Minor control signals not required by all circuit portions need only run to one edge in order to connect only to one adjacent circuit portion.

For a microprocessor system the individual circuit portions might contain the processor and basic memory, asynchronous receiver-transmitter, digital outputs, digital inputs, analogue to digital converter, multiplexer, extension memory etc. A very simple system might consist only of the processor and digital input and output sections.

Embodiments of this invention will now be described, by way of example, with reference to the accompanying drawing in which.

Figure 1:
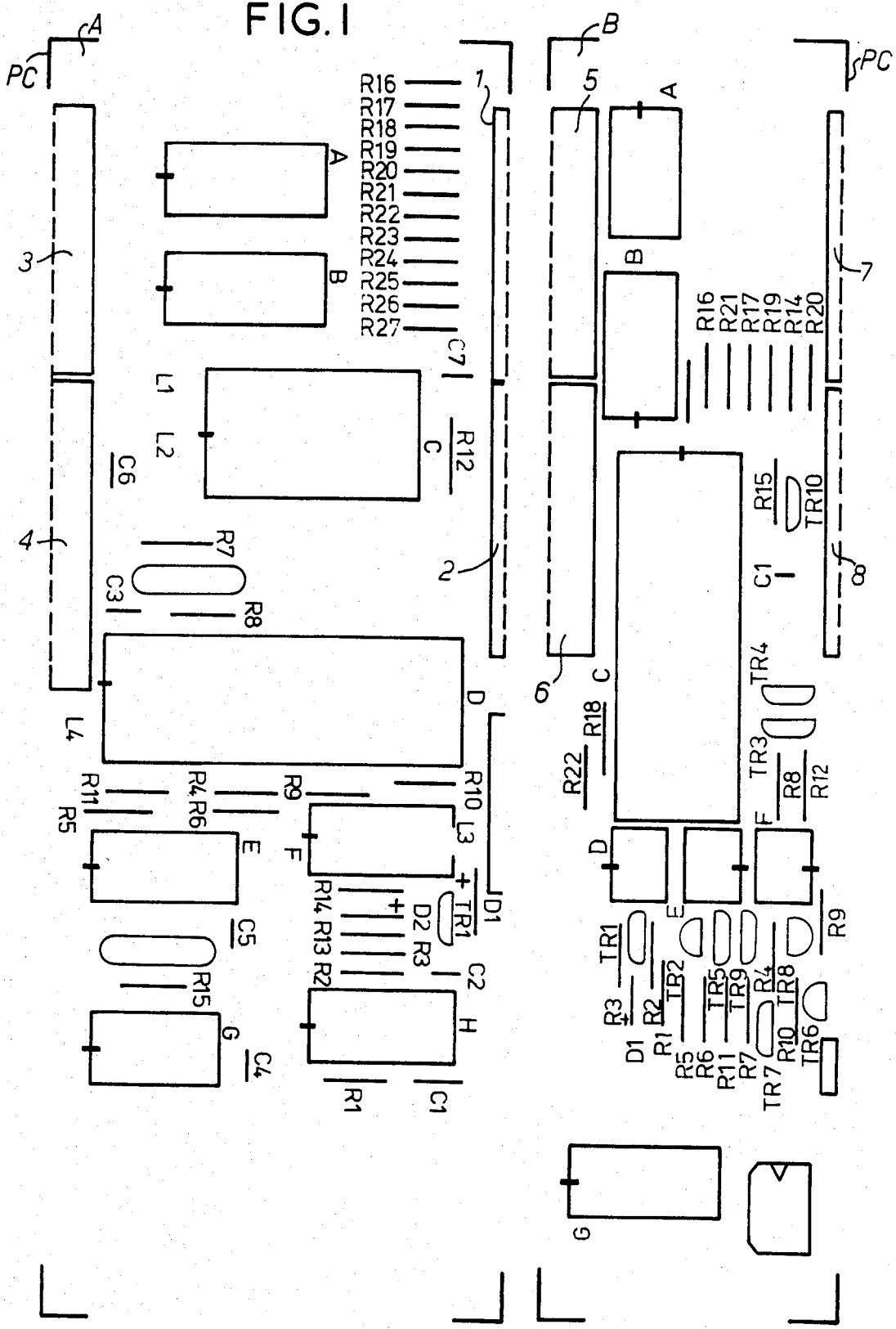
FIG. 1 is a schematic diagram of a microprocessor system embodying this invention.

Referring to FIG. 1 two circuit portions A,B of a microprocessor system include various components mounted on respective printed circuit boards PC each of which comprises a substrate of electrically insulating material on the back (opposite side to that seen in FIG. 1) of which is formed a copper conductor printed circuit. The printed circuit has been formed using a conventional photographic process in which visual representations (in the form of photographic elements such as negative-or positive-image plates or films) of the circuit portions have been used. However, the arrangement of the printed circuit of each circuit portion is such that inter-p.c.b. connections to the circuit portion are provided via edge connector arrangements 1,2,3,4 (for circuit portion A) or 5,6,7,8 (for circuit portion B). In fact, since circuit portions A and B are to be interconnected, the connector arrangements 1,2 are respective mirror images of the connector arrangements 5,6 when the two boards are placed side by side so that, using male, female connectors, the two boards can be interconnected directly without using frames or wiring.

As mentioned above, in certain cases it may be convenient to mount the boards of a system in a wired frame to achieve the required interconnections. However, in the case illustrated, since each board has connector arrangements on opposite edge portions (the actual connectors are male on one edge portion and female on the opposite edge portion), a series of boards can be directly interconnected side-by-side. In this case some of the connections (e.g. address, data control buses) would run across the board between the appropriate connectors. It may prove expedient to arrange for the connector arrangements of each pair 1,3; 2,4; 5,7; 6,8 to be identical. Also connector arrangements may be provided on other edge portions (those at right angles to those shown in FIG. 1 as carrying connectors) and where stacking is desirable from a space-economy point of view, vertical connectors (pins or strip cables) may be used.

Preferably, however, the system illustrated in FIG. 1 is mounted on a single printed circuit board formed using a photographic process in which visual representations (in the form of photographic elements such as negative or positive image plates or films) of the respective circuit portions A, B have been juxtaposed so that required interconnections between the circuit portions are established as the result of the visual pattern or image presented, during the photographic process, by the juxtaposed representations. The juxtaposition is such that the image of each inter-p.c.b. connection conductor of the arrangements 1,2 of circuit portion A overlaps the image of each inter-p.c.b. connection conductor of the arrangements 5,6 of the circuit portion B so that in the overall visual pattern the overlapping images form visually continuous (at the junction) interconnections between the circuit portions A and B. Clearly the mirror symmetry of the pair of the connector arrangements 1,5 and 2,6 is essential for the formation of overlapping images of corresponding connectors.

In order to simplify the mechanical construction it is convenient to mount the connectors which are to provide external connection to the composite board, at the same end of each of the respective circuit portions. When printed together, the connectors of the plurality of board sections will lie along the same edge of the composite board, giving easy access to these external connections.

If such a system is required as a mechanically self-contained unit, the composite board may be mounted on a flat plate of suitable size, slightly larger than the board itself, and enclosed by a cover that leaves that side of the board carrying the external connectors exposed, so providing the necessary external connections without using any further wiring. Bulky and heavy items may be mounted on the inside of the cover.

Figures 2, 7:
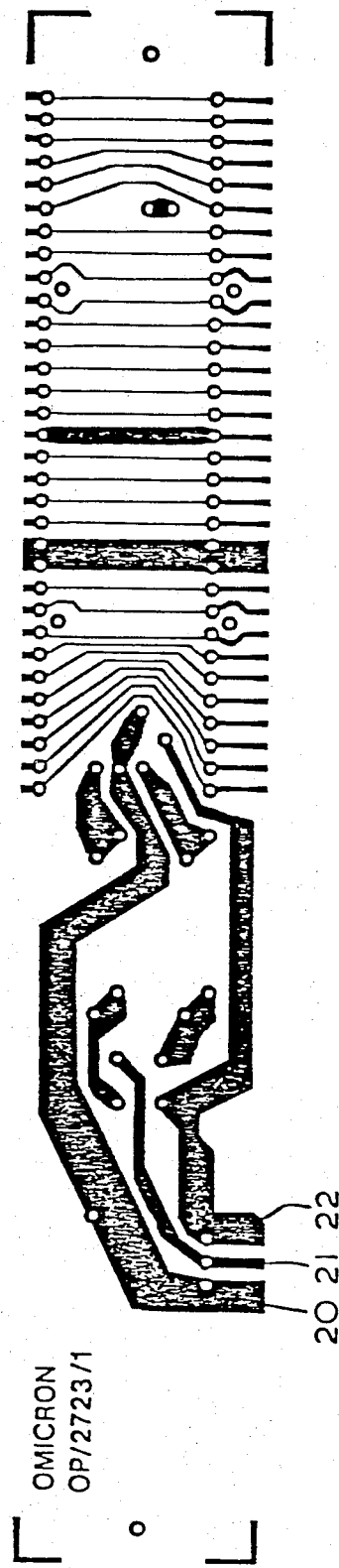
FIG. 2 is a schematic diagram of the printed circuit layout of a printed circuit board of a power supply unit embodying this invention.
FIG. 7 is a schematic block diagram of a modular microprocessor system embodying this invention.

Referring to FIG. 2, the printed circuit layout shown illustrates how most of the inter-p.c.b. connections of a power supply unit for a microprocessor system run across the visual representation (and would run across the corresponding board if produced). Only three connectors 20,21,22 extend to one side only of the representation. These connectors are in fact power supply conductors. Thus the power supply unit can readily be incorporated as a component board of a board assembly or as a circuit portion of a system formed on a single printed circuit board.

The circuit shown in FIG. 2 is an example of one which is suitable for production as a single-sided printed circuit board which can be used in combination with other double-sided and/or single-sided p.c.b. sections (as in a p.c.b. assembly or in a unitary p.c.b.).

Referring now to FIGS. 3 to 6, there are shown the various representations used in forming a unitary printed circuit board for a microprocessor system.

Since the design and operation of the microprocessor system do not directly form part of this invention and since the only features of interest relate mainly to the formation of the printed circuit board, the description will concentrate on these latter features.

Figure 3:
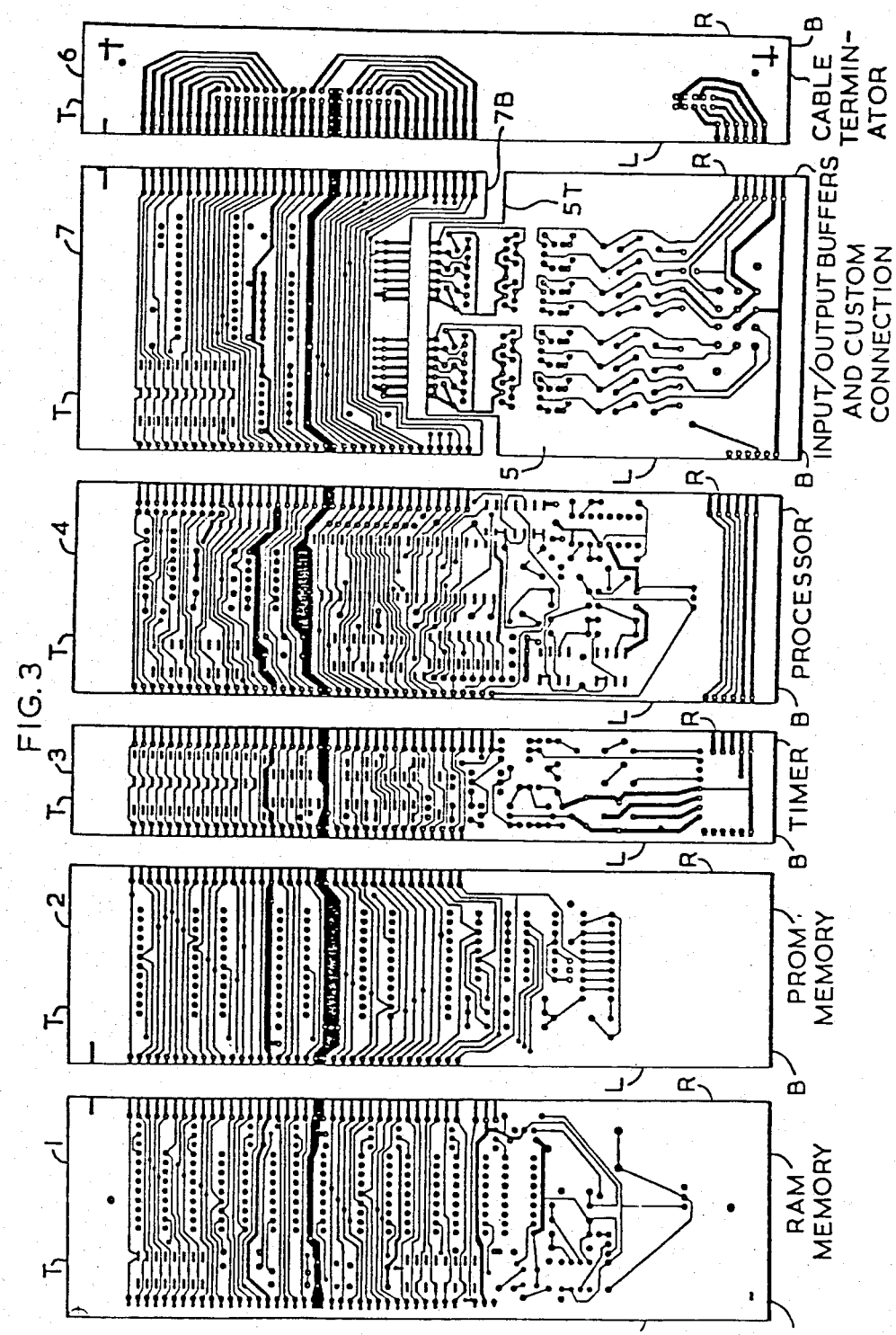
FIG. 3 is an exploded plan view of a unitary p.c.b. representation illustrating the individual p.c.b. section representations prior to formation of the unitary representation.
Figure 4:
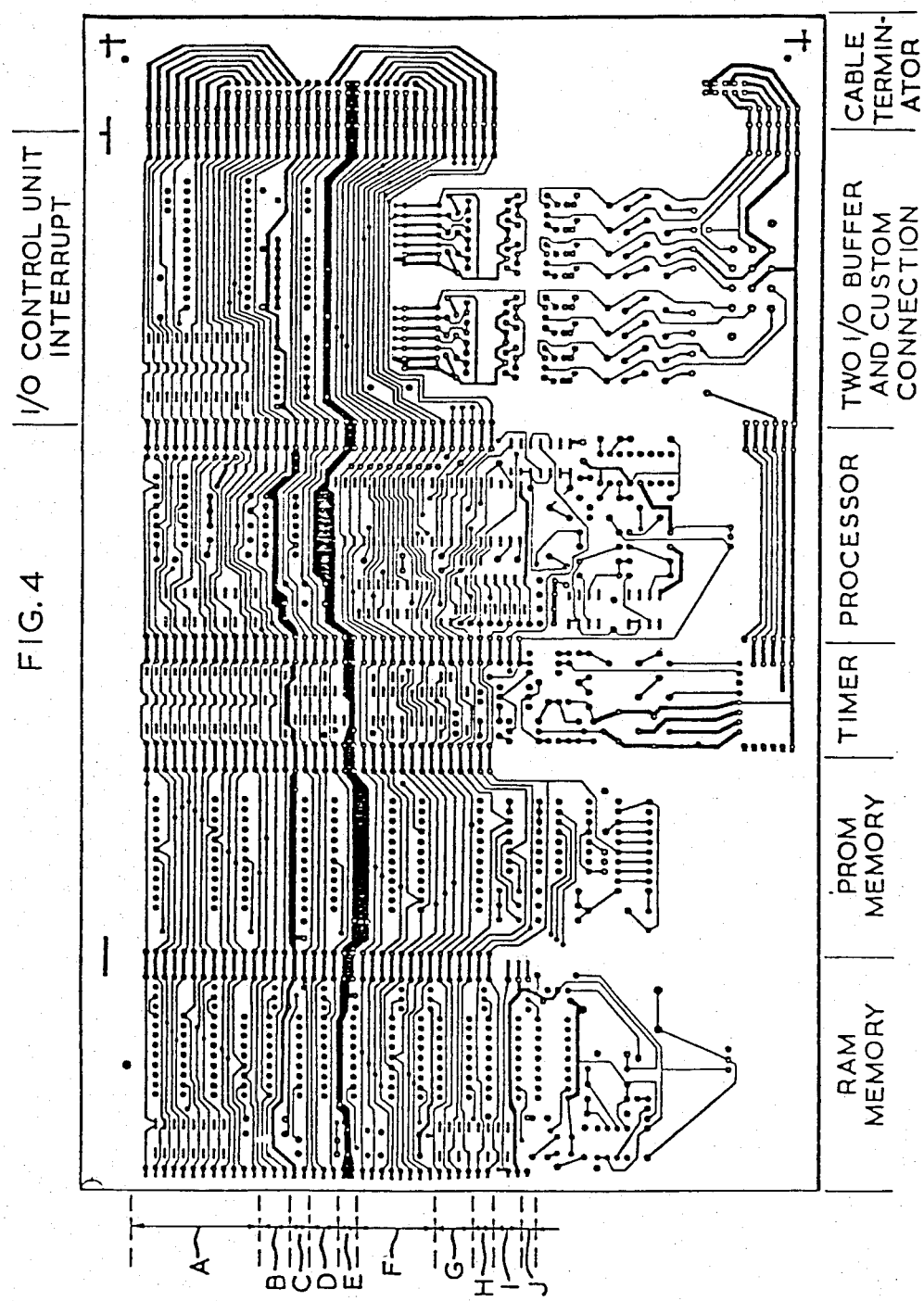
FIG. 4 is a plan view of the unitary representation formed from the p.c.b. section representations shown in FIG. 3.

As can be seen from FIGS. 3 and 4 one side (the "copper side") of the unitary p.c.b. for the system is formed using seven individual representations 1 to 7 of p.c.b. sections. The general functions carried out by the respective p.c.b. sections are indicated in FIGS. 3 and 4 for the representations 1 to 6 while the representation 7 (above representation 5 in the FIGS.) relates to input/output control and interrupt functions.

The individual representations 1 to 7 thus represent functional units which are to be combined to form the microprocessor system. Each representation is formed using a conventional photographic method to produce a positive film print which is shown in FIG. 3. Each representation is provided with inter-p.c.b. connection portions at one or both of the vertical sides as seen in FIG. 3. Apart from a general power supply connection, connections external of the system (where provided) are grouped mainly at the bottom (as seen in FIG. 3) of the representation 5 and in representation 6 which is associated with a standard cable terminator arrangement. This ensures easy access to these external connections which may be standard plug/socket units or may instead be edge connectors.

As can be seen from FIGS. 3 and 4 these external connections are associated with standardised sets of six connection portions.

The inter-p.c.b. connection portions are standardised as far as possible at the upper end (as seen in FIG. 3) of the representations with the connection portions at the right hand sides of the representations comprising lands of a first size longer than the lands of a second size at the left hand sides.

The inter-p.c.b. connection portion at the upper ends of the representations form portions of groups of circuit lines (bus lines) extending completely across some of the rectangular representations (the representations 5 and 7 can be regarded as rectangular since they have only been shown complementally shaped at their adjacent edges in FIG. 3 so as to show clearly how they fit together with each other and with the other p.c.b. section representations). Those circuits lines which extend completely across the representations 1 to 4 and 7 represent lines which are common to most p.c.b. sections. These lines are indicated as groups (of one or more lines) A to F in FIG. 4. Groups G and H are examples of lines which extend only across some of the p.c.b. sections (1 to 3 and 5) but terminate on representation 4. The functions of these groups A to H are:

A—Address
B—Strobes
C—Power
D—Control
E—0 Volts
F—Data
G—Address
H—Resets and Interrupts There are lines which extend across only one representation (such as the group I in the RAM memory which are not connected to other p.c.b. sections in the system illustrated here). Finally there are lines which terminate in the relevant representation and extend to connection portions at only one edge of the representation. These last lines are common to least p.c.b. sections.

As can be seen in FIGS. 3 and 4 the connection portions corresponding to the various lines are spaced from the top edge of the representations by distances dependent on the number of p.c.b. sections to which their associated lines are common. The greater the number of p.c.b. sections to which a line is common, the smaller is the distance of the connection portions of the line from the top edge (as seen in FIGS. 3 and 4).

It is to be noted that since the p.c.b. section corresponding to the representation 6 could be substituted by edge connectors secured to the p.c.b. sections corresponding to the representations 5 and 7, some of the lines might in an alternative embodiment extend across all the representations if the representations 5 and 7 were formed as a unitary representation. Alternatively this latter combination (not unitary) illustrates how inter-p.c.b. connections can be made in two different directions, with the lines leading to the connection portions at the bottom edge of the representation 7 being connected to the circuit portion of the relevant p.c.b. section on the other side (FIG. 5) of the double-sided p.c.b. section. The representation 5 substantially corresponds to an example of a single-sided p.c.b. section being combined with other (double-sided) p.c.b. sections.

While the main body of circuit lines on the copper side (FIGS. 3 and 4) of the double-sided p.c.b. sections run generally in a direction across the drawing, the main body of circuit lines on the "component" side (FIG. 5) run generally in the transverse direction. The main body of lines on the copper side of the single-sided p.c.b. section (representation 5) run transverse to those on the copper sides of the double-sided p.c.b. sections.

Figure 5:
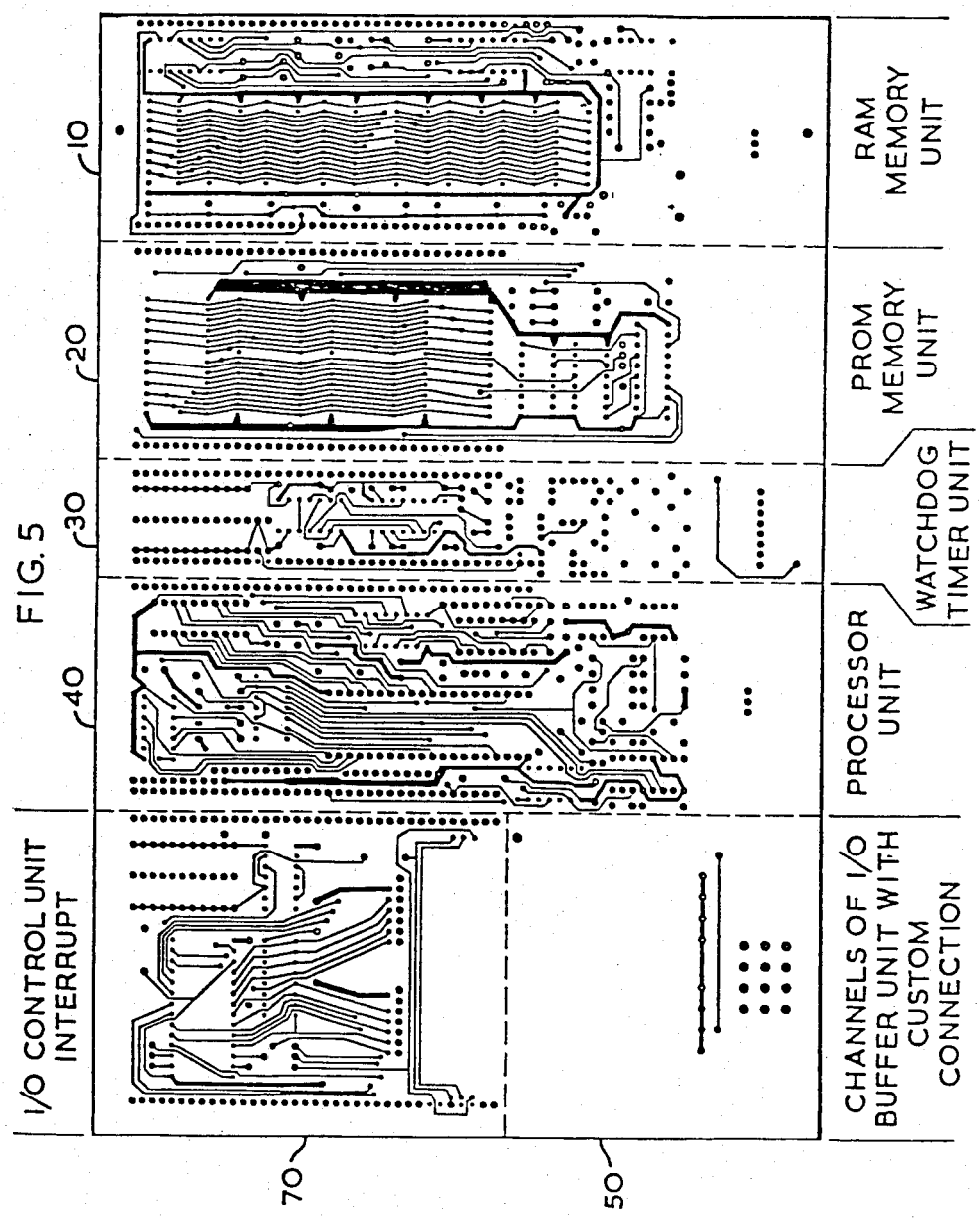
FIG. 5 is a plan view of a representation of the other side of the unitary double-sided p.c.b. which can be formed also using the representation shown in FIG. 4.

Referring to FIG. 5, the representations of the component sides of the p.c.b. sections corresponding to 1 to 5 and 7 on the copper side are referenced 10 to 50 and 70 and shown individually enclosed in broken line although FIG. 5 illustrates the unitary representation formed from the individual representations 10 to 50 and 70. (There is no corresponding component-side representation corresponding to the copper-side representation 6).

The formation of a unitary representation will now be described with reference to FIGS. 3 and 4.

The positive film prints embodying the representations are arranged as shown in FIG. 3 and then made to overlap, with the short lands overlying the long lands (left sides overlying right sides as seen in FIGS. 3 and 4 except for representations 5 and 7 where the top edge of 5 overlies the bottom edge of 7) so as to produce the visual pattern shown in FIG. 4. A contact negative of the composite is then produced photographically and the negative is edited (using opaque paint for deletion and emulsion removal for addition). Such an editing process could be used to provide the visual continuity between connection portions if (in an extreme case) the negative corresponded to FIG. 3. Such "bridging" may however be required in less extreme cases where overlapping of individual representations is inappropriate or insufficient to achieve continuity of all inter-p.c.b. connections.

Figure 6:
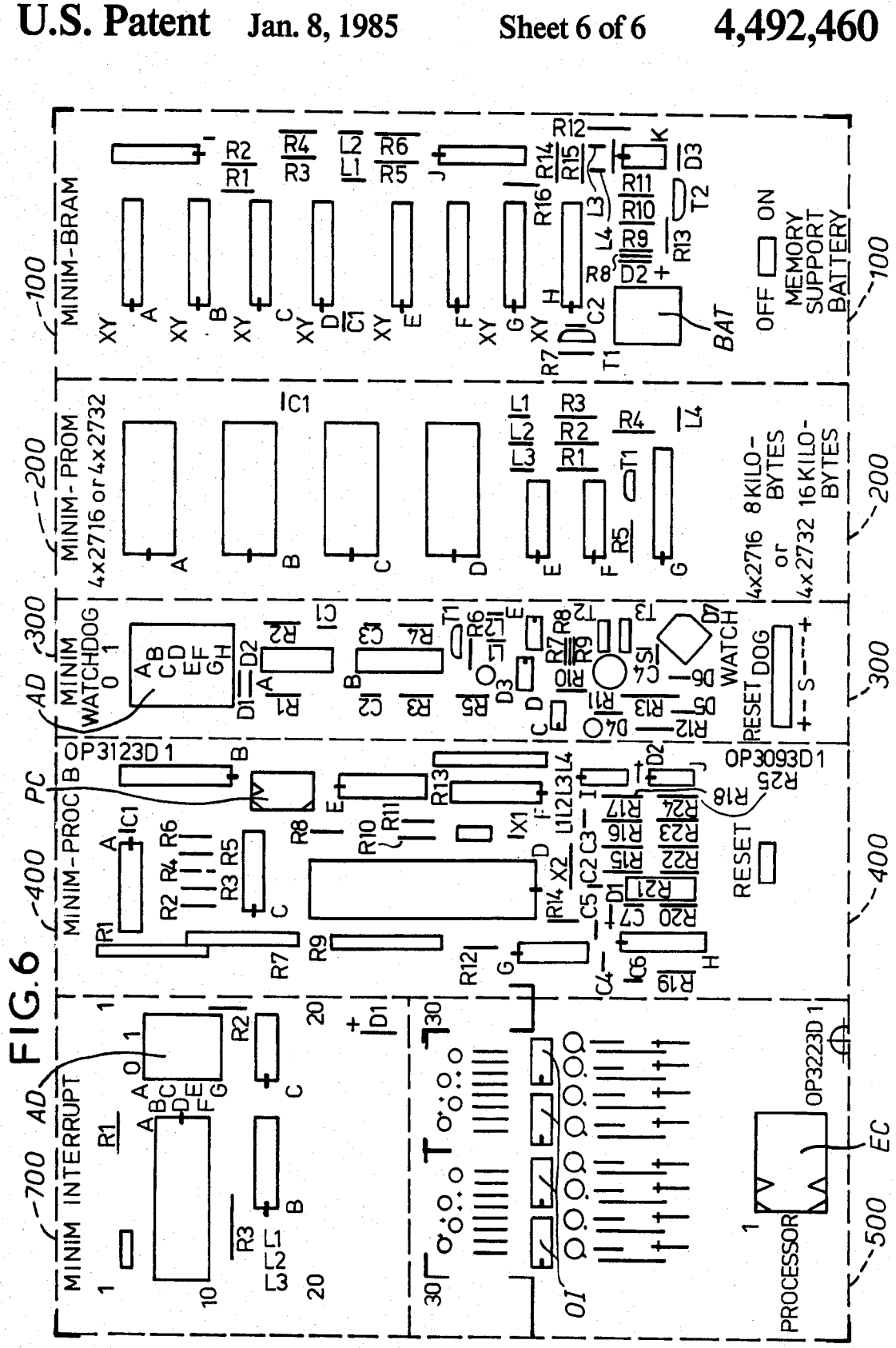
FIG. 6 is a plan view of the screen print to be applied to the side whose representation is shown in FIG. 5.

This unitary representation can then be used with other unitary representations as shown in FIGS. 5 and 6 to produce a unitary printed circuit board on which the component positions (FIG. 6) are marked on the component side using a silk screen process. The unitary representation shown in FIG. 6 is also formed from individual representations 100 to 500 and 700.

FIG. 6 also illustrates, in representations 300 and 700, how, in order to facilitate the modular construction of the microprocessor system, the modular sections can be provided with their own diode address decoders (AD) so that the respective modules can be reached at any point on the address bus.

The components in the p.c.b. sections and indicated by the various markings shown in FIG. 6 are indicated below in relation to the relevant p.c.b. section function except for:

| | | |
|---|---|---|
| C — capacitors | | |
| D — diodes | | |
| L — links | | used with reference numerals at various places over the unitary representation |
| R — resistors | | |
| T — transistors | | |

| RAM MEMORY | | PROM MEMORY | |
|---|---|---|---|
| A to H | — memory chips | A to D | — memory chips |
| I and J | — control chips | E | — address control chips |
| K | — amplifier | F | — address control chips |
| BAT | — battery | G | — address control chips |
| TIMER | | PROCESSOR | |
| AD | — diode address decoder | A | — control buffer |
| | | B | — address buffer |
| A and B | — timer chips | C | — control logic |
| C | — optical isolators | D | — processor chip |
| D | — optical isolators | E | — control buffer |
| E | — optical isolators | F | — control decoder |
| S | — output connector | G | — control logic |
| | | H | — reset timer |
| INPUT/OUTPUT BUFFERS | | I | — reset detectors |

| | -continued | |
|---|---|---|
| AND CUSTOM CONNECTION | J | — reset detectors |
| OI | — optical isolators X1 | — clock crystal |
| EC | — external connector X2 | — clock crystal |
| INPUT/OUTPUT CONTROL | PC | — power supply |
| AND INTERRUPT | | connector |
| A | — interrupt control chip | |
| B | — buffer chip | |
| C | — buffer chip | |
| AD | — diode address decoder | |

As indicated earlier, the individual representations may be used for forming the individual p.c.b. sections as separate modules which may be combined in a p.c.b. assembly using mounting frames or edge connectors. This procedure is particularly useful in designing and testing a modular prototype system.

Referring now to FIG. 7, there is shown a form of microprocessor system to which this invention has particularly advantageous application.

Here two processors P1, P2 arranged for operating in parallel have a common main memory MC and respective working memories M1, M2. Buffer circuits B1, B2 are provided to control access to the common memory while interfaces I1, I2 provide external input/output facilities.

While the general form of such a system is known it has hitherto been difficult to achieve in practice on a modular basis using mounting frames and a "mother" board due to the problems of controlling access to the common memory. It can be appreciated that the modular arrangement provided by this invention enables a board assembly (using edge connectors) or a unitary p.c.b. to be readily used for such a system and in fact for extended forms of such systems.

The embodiments described above have the advantage that the circuit master for a new function may be prepared and tested, and then added to an existing circuit, leaving the master for the existing circuit entirely untouched, thereby removing any possibility that errors may be introduced into parts of the circuit that have already been tested.

While the representations of the circuit portions referred to above are visual representations (e.g. photographic plates or films) it will be appreciated that the necessary visual data can be recorded in various forms other than visual to provide the required representations. Thus the latter may comprise magnetic tape, discs or drums or other non-visual data storage medium and, in particular, may enable operation of a processor system and associated video display unit which provide the visual pattern on screen for checking (and possible modification) before providing a print-out drawing or even a corresponding film or plate of the video display.

I claim:

1. A method of making a system of representations of printed circuit board sections and comprising the steps of forming at least two printed circuit board (p.c.b.) section representations having portions corresponding to inter-p.c.b. section connections which are to provide interconnections between two circuit portions respectively represented by the representations, arranging each p.c.b. section to correspond to a respective one of a plurality of functional modules comprising apparatus based on the complete circuit and arranging the corresponding inter-p.c.b. section connection portions of each of the representations in predetermined positions such that visually continuous interconnections can be formed between the circuit portions when the representations are caused to provide a visual pattern of the complete circuit represented by the combined representations, at least one of the representations, being of a first functional module, being capable of being substituted by a representation of a second functional module different from the first functional module while still maintaining the visual continuity of the necessary inter-p.c.b. section interconnections with the representations immediately adjoining the substituted representation.

2. A method according to claim 1 characterised by arranging that at least some of said inter-p.c.b. section connection portions represent parts of circuit lines extending completely across at least one of the p.c.b. sections.

3. A method according to claim 2 characterised by arranging that at least some of said inter-p.c.b. section connection portions represent parts of circuit lines extending across all the p.c.b. sections.

4. A method according to claim 1 characterised by arranging that the section representations represent generally rectangular p.c.b. sections and that the inter-p.c.b. section connection portions represent connections positioned at a first edge of the relevant p.c.b. section and extending in a column starting near a second edge adjacent the first edge.

5. A method according to claim 4 characterised by arranging that the representations represent said circuit lines extending substantially in a direction parallel to said second edge.

6. A method according to claim 5 characterised by arranging that the representations represent said circuit lines and their associated inter-p.c.b. section connections positioned nearer said second edge than inter-p.c.b. section connections and their associated circuit lines which extend only to one edge.

7. A method according to claim 6 characterised by forming at least three said representations and by arranging that the latter represent each said circuit line, extending via inter-p.c.b. section connections, such as to be positioned at a distance from said second edge dependent on the number of the p.c.b. sections on which the circuit line extends, the greater said latter number is, the smaller is said distance from said second edge.

8. A method according to claim 1 characterised by arranging that the representations represent all the inter-p.c.b. section connections so as to be positioned at at least one of two substantially parallel edges of the respective p.c.b. section.

9. A method according to claim 1 characterised by forming an even number, greater than or equal to four, or representations half the number of which represent respective one sides of double-sided p.c.b. sections, the other half representing the respective other sides.

10. A method according to claim 9 characterised by forming the representations for each double-sided p.c.b. section such that the inter-p.c.b. section connections on one side are positioned at at least one of the two edges which are transverse to the edges at at least one of which are positioned the inter-p.c.b. section connections for circuit lines on the other side of the double-sided p.c.b. section.

11. A method according to claim 9 or claim 10 characterised by forming further representations representing single-sided p.c.b. sections which are to form portions of the complete circuit.

12. A method according to claim 1 characterised by arranging that each pair of inter-p.c.b. section connection portions which are to provide a visually continuous interconnection, represents two lands of different lengths such that all the lands on the same edge of a p.c.b. section are of the same length.

13. A method of making a composite visual representation of a printed circuit board characterised by causing representations, made according to claim 1, to provide a visual pattern corresponding to the complete circuit so that corresponding inter-p.c.b. section connection portions provide visually continuous interconnection portions between the visual representations and using the visual pattern to form a unitary representation of the complete circuit.

14. A method according to claim 13 characterised by forming said representations as positive film prints, arranging the latter to form said visual pattern, forming said unitary representation as a negative film print and editing the latter.

15. A method of making a printed circuit board characterised by making a composite visual representation by a method according to claim 13 and by forming a unitary printed circuit board from the unitary representation.

16. Means for making a printed circuit board comprising at least two printed circuit board section representations having portions corresponding to inter-p.c.b. section connections which are to provide interconnections between two circuit portions respectively represented by the representations, wherein each p.c.b. section is arranged to correspond to a respective one of a plurality of functional modules comprising apparatus based on the complete circuit and arranging the corresponding inter-p.c.b. section connection portions of each of the representations in predetermined position such that visually continous interconnections can be formed between the circuit portions when the representations are caused to provide a visual pattern of the complete circuit represented by the combined representations, at least one of the representations, being of a first functional module, being capable of being substituted by a representation of a second functional module different from the first functional module while still maintaining the visual continuity of the necessary inter-p.c.b. section interconnections with the representations immediately adjoining the substituted representation.

17. A method of making a printed circuit board assembly characterised by making a system of representations according to claim 16 by forming p.c.b. sections from the representations and by interconnecting the p.c.b. sections via the inter-p.c.b. connections formed by means of the appropriate portions of the representations, so as to form the complete circuit.

18. A printed circuit board formed by a method according to claim 15.

19. A printed circuit board assembly produced by a method according to claim 17.

20. A microprocessor system characterised in that it comprises a printed circuit board according to claim 18.

21. A microprocessor system according to claim 20 characterised in that at least some of the p.c.b. sections have respective address decoders.

22. A microprocessor system according to claim 20 characterised in that it includes two processor circuits arranged to operate in parallel using a common memory.

* * * * *